United States Patent [19]

Duhl et al.

[11] 4,402,772

[45] Sep. 6, 1983
:::

[54] SUPERALLOY SINGLE CRYSTAL ARTICLES

[75] Inventors: David N. Duhl, Newington; Alan D. Cetel, West Hartford, both of Conn.

[73] Assignee: United Technologies Corporation, Hartford, Conn.

[21] Appl. No.: 301,801

[22] Filed: Sep. 14, 1981

[51] Int. Cl.$^3$ .............................................. C22C 19/05
[52] U.S. Cl. ...................................... 148/404; 148/3; 148/162; 148/410
[58] Field of Search .................... 148/32, 32.5, 162, 3; 75/171

[56] References Cited

U.S. PATENT DOCUMENTS 4,209,348  6/1980  Duhl et al. .......................... 148/162

Primary Examiner—R. Dean
Attorney, Agent, or Firm—Charles E. Sohl

[57] ABSTRACT

A specific composition range and process sequence are described for the production of single crystal superalloy articles which have an exceptional combination of high temperature mechanical properties and resistance to oxidation and hot corrosion. The nominal composition is 6% Ta, 9% Cr, 5% Co, 1% Ti, 1% Mo, 7% W, 5.5% Al, 0.15% Hf balance essentially nickel. Material of this composition is cast and solidifed in single crystal form and heat treated to produce an optimum microstructure.

6 Claims, No Drawings

SUPERALLOY SINGLE CRYSTAL ARTICLES

DESCRIPTION

1. Technical Field

This invention relates to the field of nickel base superalloys and superalloy articles for use at elevated temperatures. This invention also relates to the field of single crystal metallic articles.

2. Background Art

The nickel base superalloy art areas has been extensively investigated for many years, and as a result there are very many issued patents in this area. These include, for example, U.S. Pat. Nos. 2,261,122, 2,781,264, 2,912,323, 2,994,605, 3,046,108, 3,166,412, 3,188,204, 3,287,110, 3,304,176 and 3,322,534.

Typically, superalloys contain chromium in levels of about 5-15% primarily for oxidation resistance, aluminum and titanium in combined levels of about 3-7% for the formation of the strengthening gamma prime phase and refractory metals such as tungsten, molybdenum, tantalum and columbium in levels of about 4-14% as solid solution strengtheners. Virtually all nickel base superalloys also contain cobalt in levels of about 5-15%, and carbon in levels of about 0.1% for grain boundary strengthening. Boron and zirconium are also often added in small amounts as grain boundary strengtheners.

Most commonly, gas turbine blades are formed by casting and the casting process most utilized produces parts having equiaxed nonoriented grains. It is well-known that the high temperature properties of metals are usually quite dependent upon grain boundary properties, consequently, efforts have been made to strengthen such boundaries (for example by the additions discussed previously), or to reduce or eliminate the grain boundaries transverse to the major stress axis of the part. One method of eliminating such transverse boundaries is directional solidification, described in U.S. Pat. No. 3,260,505. The effect of directional solidification is to produce an oriented microstructure of columnar grains whose major axis is parallel to the stress axis of the part and which have no grain boundaries perpendicular to the stress axis of the part. A further extension of this concept is the utilization of single crystal parts in gas turbine blades. This concept is described in U.S. Pat. No. 3,494,709. The obvious advantage of the single crystal blade is the complete absence of grain boundaries. In single crystals, therefore, grain boundaries are eliminated as potential weaknesses, hence, the mechanical properties of the single crystal are completely dependent upon the inherent mechanical properties of the material.

In the prior art alloy development, much effort was devoted to the solution of problems resulting from grain boundaries, through the addition of elements such as carbon, boron, and zirconium. Another problem which prior art alloy development sought to avoid was the development of deleterious phases after long term exposures at elevated temperatures (i.e. alloy instability).

U.S. Pat. No. 3,567,526 teaches that carbon can be completely removed from single crystal superalloy articles and that such removal improved fatigue properties.

In single crystal articles which are free from carbon, there are two important strengthening mechanisms. The most important strengthening mechanism is the intermetallic gamma prime phase, $Ni_3(Al, Ti)$. In modern nickel base superalloys, the gamma prime phase may occur in quantities as great at 60 volume percent. The second strengthening mechanism is the solid solution strengthening which is produced by the presence of the refractory metals such as tungsten and molybdenum in the nickel solid solution matrix. For a constant volume fraction of gamma prime, considerable variations in the strengthening effect of this volume fraction of gamma prime may be obtained by varying the size and morphology of the gamma prime precipitate particles. The gamma prime phase is characterized by having a solvus temperature above which the phase dissolves into the matrix. In many cast alloys, however, the gamma prime solvus temperature is in fact above the incipient melting temperature so that it is not possible to effectively solutionize the gamma prime phase. Solutionizing of the gamma prime is the only practical way in which the morphology of the gamma prime can be modified, hence for many commercial nickel base superalloys the gamma prime morphology is limited to the morphology which resulted from the original casting process. The other strengthening mechanism, solid solution strengthening, is most effective when the solid solution strengthening elements are uniformly distributed throughout the nickel solid solution matrix. Again, this strengthening is reduced in effectiveness because of the nature of the casting process. Practical nickel base superalloys freeze over a wide temperature range. The freezing or solidification process involves the formation of high melting point dendrites followed by the subsequent freezing of the lower temperature melting interdendritic fluid. This solution process leads to significant compositional inhomogenities throughout the microstructure. It is theoretically possible to homogenize such a microstructure by heating as elevated temperature to permit diffusion to occur, however, in practical nickel base superalloys the maximum homogenization temperature, which is limited by the incipient melting temperature, is too low to permit significant homogenization.

U.S. Pat. No. 3,887,363 describes a nickel superalloy composition suited for directional solidification which is characterized by the absence of carbon and the presence of rhenium and vanadium.

U.S. Pat. No. 4,116,723 relates to the heat treatment of single crystal articles having a composition such that there is a useful heat treatment range between the gamma prime solvus temperature and the incipient melting temperature and such solution heat treatment temperature is high enough to permit essentially complete homogenization within commercially feasible times. Following such a homogenization treatment, the alloys are cooled and then heated to an intermediate temperature for a controlled precipitation step.

U.S. Pat. No. 4,222,794 describes single crystal articles containing (nominally) 5.2% chromium, 5.4% aluminum, 1.1% titanium, 2.0% molybedenum, 4.9% tungsten, 6.4% tantalum, 3% rhenium, 0.4% vanadium, balance nickel. U.S. Pat. No. 4,209,348 describes a single crystal superalloy article having a nominal composition of 12% tantalum, 10% chromium, 5% cobalt, 1.5% titanium, 4% tungsten, 5% aluminum, balance essentially nickel.

DISCLOSURE OF INVENTION

This invention relates to superalloy articles suited for use at elevated temperatures and particularly suited for use as an element in a gas turbine engine. The composition of the article is restricted to a range comprising the following: 3.5-7% Ta, 7.5-11% Cr, 4-6% Co, 0.6-1.8% Ti, 0-2.5% Mo, 6-12% W, 4.5-6.0% Al, 0.05-0.5% Hf, balance nickel.

This composition is produced in single crystal form by known casting techniques and is then heat treated by homogenization at an elevated temperature followed by an aging treatment at a lower temperature.

When processed as described in the present application, single crystal articles of the preceding composition have an exceptional combination of properties. The combination of these properties including mechanical strength at elevated temperatures and resistance to oxidation and hot corrosion at elevated temperatures has not been achieved by any other composition known heretofore. Articles of the present composition are lower in cost than prior art articles with equivalent properties and are also somewhat less dense.

The foregoing, and other objects, features and advantages of the present invention will become more apparent in the light of the following detailed description of the preferred embodiment.

BEST MODE FOR CARRYING OUT THE INVENTION

The present invention concerns single crystal articles, which have a highly desirable combination of properties which make them particularly suited for use as gas turbine engine components. In particular, the composition to be described has creep properties which are somewhat better than those processed by the best cast single crystal articles cast heretofore in combination with oxidation properties which are comparable to those known prior art properties. A significant benefit possessed by the present invention is that the tantalum level is significantly reduced from that of the best prior art articles. Tantalum is a strategic element and it is important to minimize such elements which are not available in the U.S. Further, tantalum is a relatively dense element and by reducing the tantalum content the density of the articles is reduced. Density is a significant property in articles to be used in rotating machinery applications and any density reduction is highly desirable. Single crystal articles according to the present invention also have enhanced heat treatability in that they have a greater temperature range between the gamma prime solvus and incipient melting temperatures than do most prior art single crystal articles.

The broad and preferred composition for the present invention are shown below in Table I. Throughout this application, all percent values are in weight percent unless otherwise specified. For optimum castability the tungsten level should be kept below about 10% for small blades (less than about 3 inches in length) and should be kept at less than about 7.5% for larger blades. For best hot corrosion resistance the molybdenum should be less than about 2% and chromium should be greater than about 7.5%. In view of its high cost and uncertain availability, tantalum should be held at a low value, e.g., less than about 6.5%. For microstructural stability the electron vacancy number $Nv_{3B}$ should be maintained at less than $[2.74 - 0.057 (W + 2 Mo)]$. For optimum coated oxidation resistance the tantalum content should be greater than about 3.5%, the hafnium should range from about 0.05 to about 0.4%, and aluminum should range from about 5 to about 6%.

Table I also shows several specific alloy compositions which fall within the scope of the invention (although alloy H has a slightly high $Nv_{3B}$ value) and two compositions which are outside the scope of the invention, Alloy 454 and PWA 1422. All of these compositions with the exception of PWA 1422 are intended for use in single crystal form while PWA 1422 is used in columnar grained form. Alloy 454 is described in U.S. Pat. No. 4,209,348 and Alloy 454 articles are generally accepted to have the best known combination of properties available in a cast article until the development of the present invention.

Table II lists the mechanical properties of certain of the alloys previously described. It can be seen that the alloys of the invention are generally comparable or superior to the Alloys 454 specimens in terms of mechanical properties. In particular, the articles of the invention have enhanced properties, relative to Alloy 454, at the lower stress levels which are typical of the stress levels encountered in gas turbine engine applications.

Table III describes the oxidation behavior of the invention article relative to the prior art and again it can be seen that in both coated and uncoated form the invention articles are similar and in some cases superior to the Alloy 454 prior art articles. The NiCoCrAlY coating referred to in Table III has a nominal composition of 23% Co, 18% Cr, 12.5% Al, 0.3% Y, balance nickel. This coating is a state of the art overlay coating which was applied by vacuum vapor deposition.

A primary attribute of the invention over the prior art is its enhanced heat treatability. To obtain the maximum possible strength from a single crystal superalloy article, it is necessary to dissolve or solutionize the coarse gamma prime particles present in the as cast article and to reprecipitate the gamma prime phase on a fine scale in a controllable fashion. This process is only possible if the gamma prime solvus temperature is less than the incipient melting temperature. For practical commercial heat treatment, a substantial range between the gamma prime solvus and the incipient melting temperature is necessary. Table IV lists these various temperatures for several of the previously described alloys and it is apparent that the compositions of the invention provide a much improved heat treatment range when compared with the PWA 1480 prior art.

TABLE I

|    | Broad   | Preferred | Alloy H | Alloy 705 | Alloy Q | Alloy R | Alloy 454 | PWA 1422 |
|----|---------|-----------|---------|-----------|---------|---------|-----------|----------|
| Ta | 3.5-7   | 4-6       | 6       | 6         | 4       | 4       | 12        | —        |
| Cr | 7.5-11  | 8.5-10.5  | 10      | 8.0       | 10.3    | 10.1    | 10        | 9        |
| Co | 4-6     | 4-6       | 5       | 5.1       | 5       | 5       | 5         | 10       |
| Ti | .6-1.8  | .8-1.4    | 1.4     | .92       | .9      | .9      | 1.5       | 2        |
| Mo | 0-2.5   | 0-1.5     | 1.5     | 1.05      | —       | —       | —         | —        |
| W  | 6-12    | 6-10      | 7.0     | 6.8       | 10      | 10      | 4         | 12       |
| Al | 4.5-6.0 | 5.0-6.0   | 5.0     | 5.6       | 5.0     | 5.4     | 5         | 5        |
| Hf | .05-.5  | .05-.3    | .1      | .1        | .1      | .1      | —         | 2.0      |

TABLE I-continued

| | Broad | Preferred | Alloy H | Alloy 705 | Alloy Q | Alloy R | Alloy 454 | PWA 1422 |
|---|---|---|---|---|---|---|---|---|
| Ni | Balance | Balance | Balance | Balance | Balance | Balance | Balance | Balance |

TABLE II

| | Alloy H | | Alloy 705 | | Alloy Q | | Alloy R | | Alloy 454 | | PWA 1422 | |
|---|---|---|---|---|---|---|---|---|---|---|---|---|
| Test Condition | Life | Advantage | Life | Advantage | Life | Advantage | Life | Advantage | Life | Advantage | Life | Advantage |
| RUPTURE LIFE | | | | | | | | | | | | |
| 1600° F./70 ksi | 215 | 3X | N.T. | — | N.T. | — | 147 | 2.1X | 165 | 2.4X | 70 | 1X |
| 1800° F./25 ksi | 1264 | 5.7X | 1040 | 4.5X | N.T. | — | N.T. | — | 608 | 2.8X | 220 | 1X |
| 1800° F./36 ksi | 100 | 3.1X | 101 | 3.1X | 75 | 2.4X | 107 | 3.3X | 90 | 2.8X | 32 | 1X |
| 2000° F./15 ksi | 459 | 15X | N.T. | — | N.T. | — | 690 | 23X | 272 | 9X | 30 | 1X |
| 2000° F./12 ksi | N.T. | — | 909 | 13X | N.T. | — | N.T. | — | 765 | 10.9X | 70 | 1X |
| 1% CREEP LIFE | | | | | | | | | | | | |
| 1600° F./70 ksi | 70 | 4.7X | N.T. | — | N.T. | — | 50 | 3.3X | 43 | 2.9X | 15 | 1X |
| 1800° F./25 ksi | 761 | 10.6X | 372 | 5.2X | N.T. | — | N.T. | — | 323 | 4.5X | 72 | 1X |
| 1800° F./36 ksi | 27 | 2.8X | 30 | 3.2X | 13 | 1.4X | 25 | 2.7X | 30 | 3.2X | 9.5 | 1X |
| 2000° F./15 ksi | 447 | 47X | N.T. | — | N.T. | — | 247 | 21.5X | 227 | 19.7X | 11.5 | 1X |
| 2000° F./12 ksi | N.T. | — | 696 | 26.8X | N.T. | — | N.T. | — | 374 | 14.4X | 26 | 1X |

LIFE IN HOURS
ADVANTAGE RELATIVE TO PWA 1422
N.T. - NOT TESTED

TABLE III

| Test Conditions | Alloy H | Alloy 705 | Alloy Q | Alloy R | Alloy 454 | PWA 1422 |
|---|---|---|---|---|---|---|
| 2100° F. Uncoated Oxidation Resistance (Hrs/Mil) | 15.5 | 19.6 | 15 | 18 | 15.7 | 4.9 |
| Life Advantage | 3.1X | 4X | 3.1X | 3.7X | 3.2X | 1X |
| 2150° F. Coated (NiCoCrAlY) Oxidation Resistance (Hrs/Mil) | 145 | 141 | 72 | 107 | 136 | 35 |
| Life Advantage | 4X | 4X | 2.1X | 3.1X | 3.9X | 1X |

TABLE IV

| | Alloy 454 | Alloy 705 | Alloy H | Alloy Q | Alloy R |
|---|---|---|---|---|---|
| Gamma Prime Solvus, °F. | 2350 | 2330 | 2310 | <2310 | 2310 |
| Incipient Melting Temp., °F. | 2365 | 2405 | 2370 | >2400 | >2400 |
| Heat Treatment Range, °F. | 15 | 75 | 60 | >90 | >90 |

The castability of the alloys of the present invention has been shown to be strongly influenced by the tungsten content of the alloy. At tungsten levels greater than 7.5% for large airfoils (greater than 3 inches) and greater than 10% for small airfoil castings, casting problems may arise. Directionally solidified alloys are subject to the formation of chains of equiaxed grains known as freckles. The presence of freckles has been shown to have a detrimental effect on alloy mechanical properties. Freckles are the result of convection currents established in the mushy zone due to a density inversion caused by the segregation that occurs during solidification. Heavy elements, such as tungsten that segregate to the solid phase, enhance freckle formation. To avoid freckle formation tungsten levels must be kept below the critical tungsten level of 7.5% for large airfoils and 10% for small airfoils and small additions of molybdenum (up to 2.0%) must be made to the alloy to retain creep strength. As molybdenum segregates to the liquid during solidification and is denser than the alloy, its presence tends to prevent the formation of freckles.

The articles of the present invention find particular utility as turbine blades for gas turbine engines. Such blades have complex shapes which can best be achieved through the investment casting technique. This technique is well-known in the art and will not be described.

To achieve the required single crystal structure, a structure free from internal grain boundaries, directional solidification techniques must be employed in combination with a grain selector to insure that only a single grain grows within the casting mold. Such techniques are shown in U.S. Pat. No. 3,494,709.

Following the casting process the parts will usually be heat treated, given a protective coating and further heat treated. The initial heat treatment will be performed at a temperature in excess of the gamma prime solvus temperature but below the incipient melting temperature in order to dissolve the gamma prime phase. For the alloys of this invention, this initial heat treatment temperature will typically be 2335°–2385° F. and the time required will be from about one to ten hours (typically four hours) although the time required may be influenced by the casting parameters employed. Rapid cooling (i.e., forced air cooling) is employed after the initial heat treatment operation to retard the growth of the gamma prime phase. The article is then coated with a protective material. Three coating techniques may be employed, pack aluminizing, vapor deposition of overlay coatings such as MCrAlY types and plasma spray deposition of overlay coating such as the MCrAlY type. Following coating deposition, the coated article is heat treated at an elevated temperature between 1800° and 2000° F. for a period of one to ten hours; four hours at 1975° F. is preferred. This heat treatment improves the coating integrity and causes growth of the gamma prime phase in the single crystal casting. Finally, a larger heat treatment at a lower temperature such as 10–40 hours at 1200°–1700° F. may be employed to produce a stable gamma prime morphology.

It should be understood that the invention is not limited to the particular embodiments shown and described herein, but that various changes and modifications may be made without departing from the spirit and scope of this novel concept as defined by the following claims.

We claim:

1. A heat treated nickel base single crystal superalloy article suited for use at elevated temperatures having a composition consisting essentially of:
   a. from about 3.5 to about 7% tantalum,
   b. from about 7.5 to about 11% chromium,
   c. from about 4 to about 6% cobalt,
   d. from about 0.6 to about 1.8% titanium,
   e. from about 0 to about 2.5% molybdenum,
   f. from about 6 to about 12% tungsten,
   g. from about 4.5 to about 6.0% aluminum,
   h. from about 0.05 to about 0.5% hafnium
   i. balance essentially nickel, said article being free from intentional additions of carbon, boron and zirconium, and said article being free from internal grain boundaries and having an average gamma prime particle size of less than about 0.5 micron and an incipient melting temperature in excess of about 2350° F.

2. An article as in claim 1 in which the tungsten level is less than 10%.

3. An article as in claim 1 in which the tungsten level is less than 7.5%.

4. An article as in claim 1 in which the molybdenum level is less than 2% and the chromium level is greater than 7.5%.

5. An article as in claim 1 in which the tantalum level is less than about 6.5%.

6. An article as in claim 1 in which the tantalum level is greater than about 3.5%, the hafnium level ranges from about 0.05 to about 0.3%, and the aluminum level ranges from 5–6%.

* * * * *